United States Patent [19]
Uomi et al.

[11] Patent Number: 5,179,567
[45] Date of Patent: Jan. 12, 1993

[54] SEMICONDUCTOR LASER DEVICE, METHOD OF FABRICATING THE SAME AND OPTICAL SYSTEM OF UTILIZING THE SAME

[75] Inventors: Kazuhisa Uomi, Hachioji; Naoki Chinone, Chofu; Masahiro Aoki, Kunitachi, all of Japan

[73] Assignee: Hitachi, Ltd., Tokyo, Japan

[21] Appl. No.: 652,676

[22] Filed: Feb. 8, 1991

[30] Foreign Application Priority Data

Mar. 6, 1990 [JP] Japan .................................. 2-54532

[51] Int. Cl.⁵ .............................................. H01S 3/19
[52] U.S. Cl. .................................................... 372/46
[58] Field of Search ...................... 372/46, 50, 45, 96

[56] References Cited

U.S. PATENT DOCUMENTS

| | | | |
|---|---|---|---|
| 4,792,959 | 12/1988 | Mueller | 372/46 |
| 4,849,982 | 7/1989 | Sawai | 372/46 |
| 4,984,244 | 1/1991 | Yamamoto et al. | 372/45 |
| 5,007,107 | 4/1991 | Takiguchi et al. | 372/45 |

*Primary Examiner*—James W. Davie
*Attorney, Agent, or Firm*—Kenyon & Kenyon

[57] ABSTRACT

A semiconductor laser device may include a structure formed separately of a light radiating region, and an electrode for injecting carriers over the light radiating region. A gap is formed between the light radiating region and the structure to introduce an air-bridge structure into the aforementioned electrode so that the capacitive component resulting from a presence of the electrode is drastically reduced.

13 Claims, 3 Drawing Sheets

SEMICONDUCTOR LASER DEVICE, METHOD OF FABRICATING THE SAME AND OPTICAL SYSTEM OF UTILIZING THE SAME

BACKGROUND OF THE INVENTION

1. Field of the Invention

The present invention relates to a semiconductor laser device suited for use in the field of optical logical operation and capable of high-speed modulations, a method of fabricating the same, and an optical system of utilizing the same.

2. Description of the Related Art

To realize a high speed semiconductor laser, it is indispensable to reduce parasitic capacitance. The semiconductor laser of the prior art of the type, in which the restriction of current is effected by burying with the p/n reverse junction, is troubled by a problem that the junction capacitance is dominantly large. As a method of reducing the parasitic capacitance of this buried heterostructure semiconductor laser (i.e., BH laser), it has been discussed by Matsumoto et al. on pp. 117 in Electron Lett. Vol. 24 (1988) that the buried semiconductor layer is partially removed from the outside of a radiative stripe. This semiconductor laser is shown in top plan view and in section, respectively, in FIGS. 2A and 2B. A p-InP buried layer 5 and an n-InP buried layer 6 are formed in the side of an active layer 3 of the mesa-stripe region which is composed of an optical guiding layer 2 and a cladding layer 4 in addition to the active layer 3. A p-electrode 8 formed over the n-InP buried layer 6 has its stripe-type electrode 8a with a width of 20 μm and its pad electrode 8b with a restricted size of about 100 μm in diameter to reduce the aforementioned p/n junction capacitance of the outside of the mesa-stripe.

SUMMARY OF THE INVENTION

However, the prior art described above has the following problems. The structure of the semiconductor laser, as shown in FIG. 2, is prepared by burying the formed mesa-stripe with the p-InP buried layer 5 and the n-InP buried layer 6 and by removing the n-InP buried layer 6 and the p-InP buried layer 5 partially by using the p-electrode 8 as a mask. This structure is troubled by the problems that the n-InP buried layer 6 just below the pad electrode 8b and the n-InP buried layer 6 just below the stripe-type electrode 8a are connected and that there is no insulator film between the pad electrode 8b and the n-InP layer 6. Specifically, the p/n junction capacitance below the pad electrode 8b is enlarged by that structure. Since, moreover, the stripe-type electrode 8a is wide, the p/n junction capacitance of that portion contributes to the large capacitance of about 7 pF as a whole, as could be understood.

Still moreover, a breakdown is liable to be induced because the n-InP buried layer 6 just below the pad electrode 8b and the n-InP buried layer below the stripe-type electrode 8a are connected. Even if, furthermore, the p/n junction capacitance below the pad electrode is to be reduced by forming the insulator film between the pad electrode 8b and the n-InP buried layer 6, this capacitance reducing effect by the aforementioned insulating film is seriously dropped because the individual n-InP buried layers 6 just below the pad electrode 8b and below the stripe-type electrode 8a are connected and are electrically substantially conductive because of the low resistance of the n-InP layers.

An object of the present invention is to provide a semiconductor laser device, which can be modulated at a high speed, and a method of fabricating the same.

Another specific object of the present invention is to provide a semiconductor laser device, which has its parasitic capacitance drastically reduced, and a method of fabricating such semiconductor laser device.

Still another object of the present invention is to provide a system for optical communications and optical logical operation by using such semiconductor laser device.

The above-specified objects can be achieved by giving a special structure to a pair of electrodes for carrier injection to a semiconductor laser device. According to one aspect of the present invention, there is provided a semiconductor laser device which comprises a mesa-stripe structure including an active region for radiating light; a buried region buried with said mesa-stripe structure; a semiconductor region formed apart from said buried region; and a pair of electrodes for injecting carriers into said active region, wherein at least one of said electrodes has an air bridge structure. This air bridge structure is called the electrode structure which is formed across said mesa-stripe region and said semiconductor region, and is named so as if a bridge were formed across the mesa-stripe region and the semiconductor region. The portion below the bridge might be filled up with not only the air but also inert gases if no capacitance were established at the time of forming the electrodes.

The electrode portions over said semiconductor region are required to have a considerable area because they are pad electrodes. The capacitance of the portions are serious, and it is important to form an insulator region between the electrode portions and the underlying semiconductor region. According to another restricted aspect of the present invention, there is provided a semiconductor laser which comprises a substrate including an active region for radiating light; a resonant structure for feeding back the light coming from said active region; a buried region formed on the side of said resonant structure; and a pair of electrodes for supplying an electric current to said active region, wherein one of said electrodes includes a first electrode portion arranged corresponding to said resonant structure and a second electrode portion electrically connected with said first electrode portion and an external power supply, the region for forming a junction capacitance below said second electrode portion being electrically isolated from said first electrode portion.

Said active region is enabled to further reduce a laser oscillation threshold valve drastically by having at least one quantum well layer. The semiconductor laser is required to have the resonant structure for resonating the light. Especially in case a wavelength stability is required for the optical communications, the so-called "distributed feedback structure" may be introduced. For example, it is effective to form a grating in the optical guiding region formed in the vicinity of the active region thereby to feed back and amplify the light on the basis of the black reflections.

The semiconductor laser device described above can be easily fabricated by devising the etching and masking. Still another aspect of the present invention, the aforementioned another object can be achieved by a method of fabricating a semiconductor laser device, which comprises the step of removing the sides of an active region formed over a substrate for radiating light and a resonant structure formed over said substrate for feeding back the light from said active region; the step of burying a semiconductor layer in said sides; the step of forming, over said semiconductor layer, a first electrode portion corresponding to said resonant structure, a second electrode portion to be connected with an external power supply, and a third electrode portion to be electrically connected with said first electrode portion and said second electrode portion; and the step of spatially isolating said semiconductor layer into a region below said first electrode portion and a region below said second electrode portion by etching said semiconductor layer by using said electrode pattern as a mask to remove said semiconductor layer below said third electrode portion.

The semiconductor laser device thus constructed exhibits its effects if it is assembled and used with the optical communication or optical logical operation system which is required for high-speed modulations. According to still another aspect of the present invention, there is provided an optical system which comprises a semiconductor laser device having the aforementioned air bridge structure introduced into an electrode for carrier injections; means for inputting an electric signal to said semiconductor laser device; means for transmitting the laser light from said semiconductor laser device; and means for receiving said laser light.

Thanks to the structure described above, the present invention is advantageous in that the parasitic capacitance of the semiconductor laser device may be simply separated into two portions, i.e., the portion below the pad electrode and the portion below the stripe-type electrode. Specifically, the capacitance of the portion below the stripe-type electrode is the junction capacitance of the p/n buried layer and can be reduced to about 1 pF or less by narrowing the width of the stripe-type electrode, i.e., the mesa-width to 10 μm or less, for example. Next, the capacitance of the portion below the pad electrode can be drastically reduced by sandwiching the insulator film below the pad electrode, as has been described above. Specifically, the capacity can be reduced to about 0.5 pF or less by sandwiching an insulator film of 6,000 Å or more made of $SiO_2$ or the like as the pad having an area of about 100 μm squares. As a result, the total capacitance can be easily dropped to 1.5 pF or less so that the frequency bandwidth can be augmented to as large as 25 GHz to 50 GHz if the resistance is 5 Ω.

Moreover, the structure of the semiconductor laser device according to the present invention can be obtained remarkably easily by the aforementioned fabrication method and can achieve big capacity optical transmissions if used as an oscillation source for the optical system.

Other advantages of the present invention will become apparent to those skilled in the art, if they read and understand the following description of the most proper embodiments of the present invention.

BRIEF DESCRIPTION OF THE DRAWINGS

The present invention can adopt a variety of components, a variety of arrangements of the components, and a variety of steps and a variety of combinations of the steps, and the drawings should be used only for describing the most proper embodiments thereof but not be construed for the scope of its restrictions.

DETAILED DESCRIPTION OF THE PREFERRED EMBODIMENTS

The present invention will be described in the following in connection with the embodiments thereof with reference to the accompanying drawings.

EXAMPLE 1

Figure 1A:
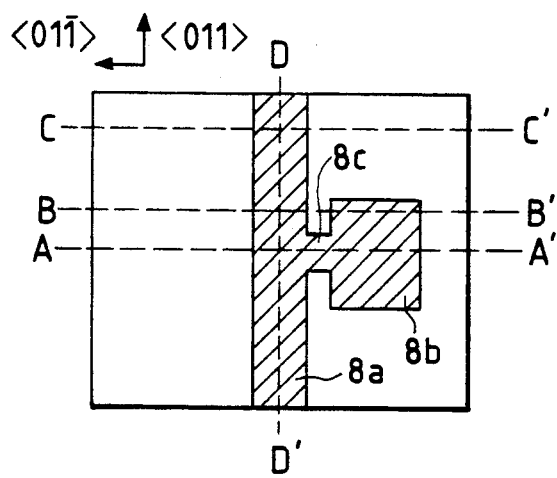
FIG. 1A is a top plan view showing one embodiment of the semiconductor laser of the present invention.
Figure 1B:
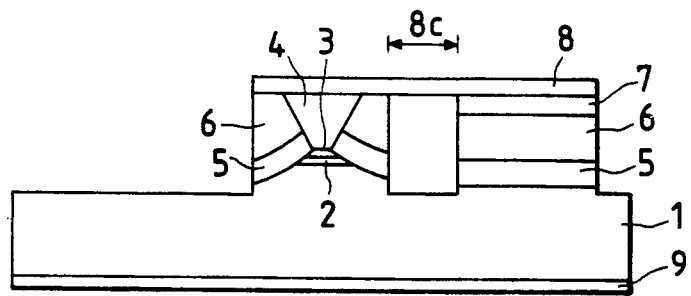
FIGS. 1B, 1C, 1D and 1E are sections showing the device shown in FIG. 1A and taken along lines A—A', B—B', C—C' and D—D', respectively.
Figure 1C:
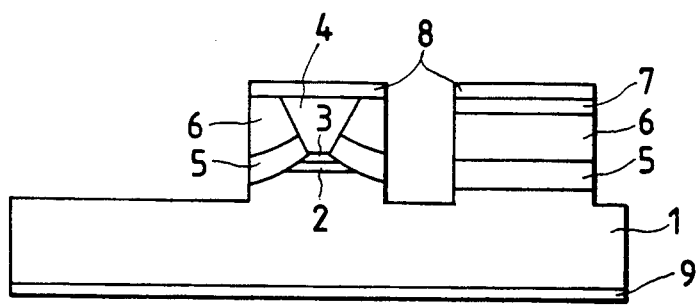
Figure 1D:
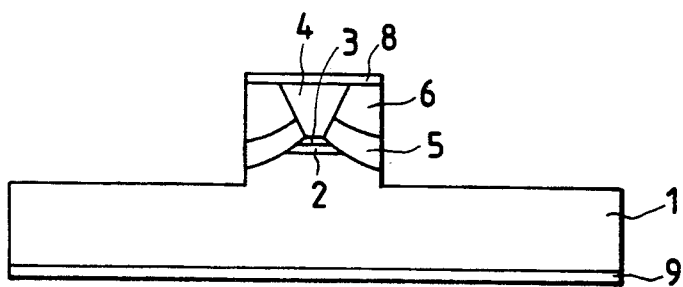
Figure 1E:
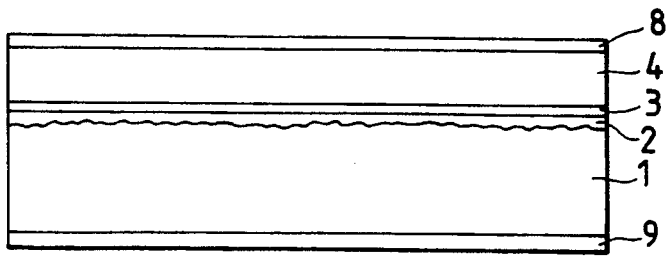
Figure 2A:
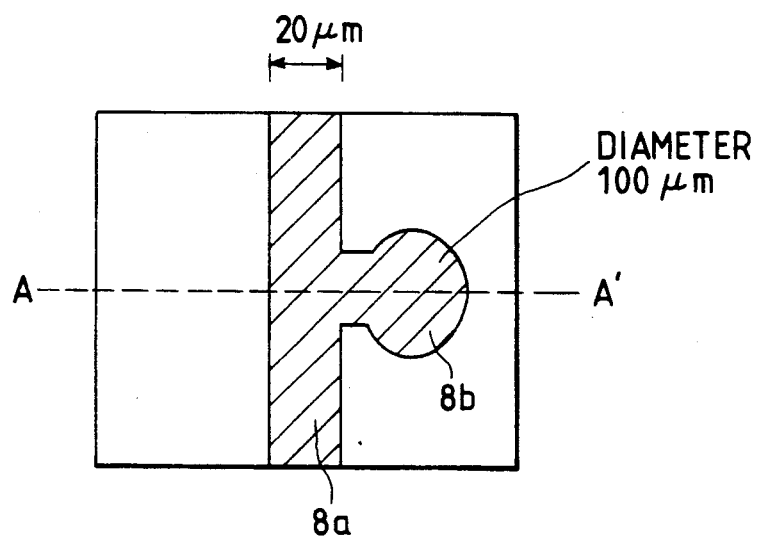
FIG. 2A is a top plan view showing a BH laser according to the prior art.
Figure 2B:
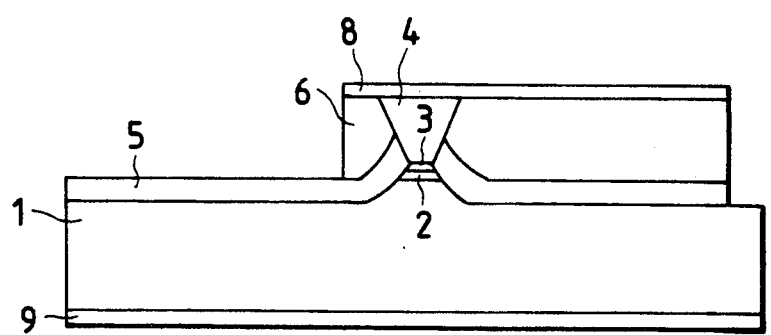
FIG. 2B is a section showing the laser of FIG. 2A.

FIG. 1A is a top plan view showing a semiconductor laser device according to the present invention, and FIGS. 1B, 1C, 1D and 1E are sections taken along lines A—A', B—B', C—C' and D—D' of FIG. 1A, respectively. Over an n-InP substrate 1 having a grown grating of a period of about 240 nm, as shown, there were sequentially grown by the MOCVD method an optical guiding layer 2 of n-InGaAsP having a thickness of 0.15 μm, an active layer 3 of InGaAsP having a thickness of 0.1 μm, and a cladding layer 4 of p-InP having a thickness of 2 μm. Next, a mesa-stripe of reverse-mesa type was so formed by the wet etching using the $SiO_2$ film as a mask that the active layer 3 might have a width of about 1 μm. After this, a buried layer 5 of p-InP having a thickness of 0.5 μm and a buried layer 6 of n-InP having a thickness of 3 μm were grown by the liquid phase epitaxy.

A $SiO_2$ film 7 having a thickness of 6,000 Å was formed below a pad electrode 8b. After this, a p-electrode 8 was formed, as shown in FIG. 1A. As shown, this p-electrode 8 was composed of: a stripe-type electrode 8a having a width of 7 μm; an air-bridge portion 8c having a width of 5 μm, and the pad electrode 8b of about 50 μm × 100 μm squares. By using this p-electrode 8 as a mask, the n-InP buried layer 6 and the p-InP buried layer 5 were etched off. At this time, the n-InP buried layer 6 and the p-InP buried layer 5 below the air-bridge portion 8C were removed by the side etching. Specifically, the portions below the air-bridge portion 8c was side-etched by determining the orientations of the substrate in advance, as shown in FIG. 1A, such that the etching liquid of hydrochloric acid will proceed its side etching in the direction of <011> but not in the direction of <01$\bar{1}$>.

Next, an n-electrode 9 was formed and cleaved to have a resonant length of 300 μm. The device thus fabricated on trial oscillated at about 10 mA and was reflected by the DFB (i.e., distributed feedback) structure of the grating, to achieve a single longitudinal mode oscillation with a slide mode suppression ratio larger than 40 dB at a wavelength of 1.55 μm. Moreover, the parasitic capacitance was about 1 pF, and the frequency bandwidth at the output power was about 30 GHz so that a 20 Gb/s NRZ modulation could be attained.

EXAMPLE 2

Figure 3A:
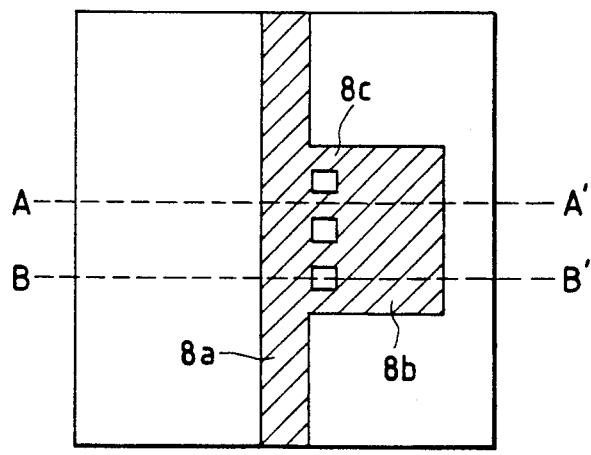
FIG. 3A is a top plan view showing another embodiment of the semiconductor laser of the present invention.
Figure 3B:
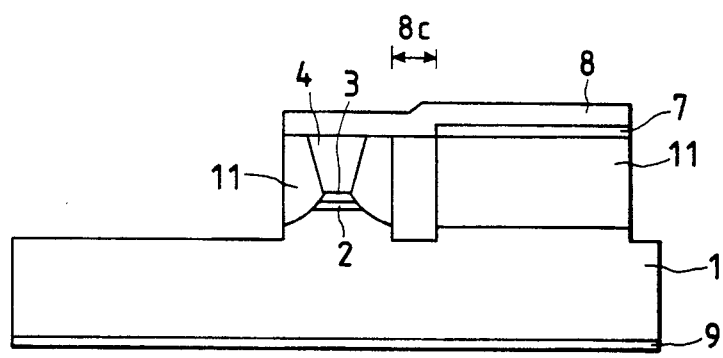
FIGS. 3B and 3C are sections showing the device shown in FIG. 3A and taken along lines A—A' and B—B', respectively.
Figure 3C:
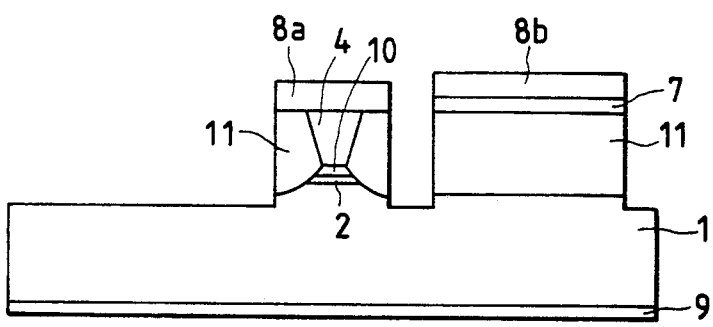

Another embodiment of the semiconductor laser device of the present invention will be described with reference to FIGS. 3A to 3C. FIG. 3A is a top plan view showing the device, and FIGS. 3B and 3C are sections taken along lines A—A' and B—B' of FIG. 3A, respectively. The present embodiment is directed to an example, in which the multi-quantum well (MQW) having a semi-insulating buried layer was applied to the DFB laser. Over an n-InP substrate 1 having a grating, there were sequentially grown by the MOCVD method an n-InGaAsP optical guiding layer 2 having a thickness of 0.2 μm, MQW active layer 3 having a thickness of 0.16 μm and a p-InP cladding layer 4 having a thickness of 3 μm. This MQW active layer had a ten-period structure of an InGaAs well layer having a thickness of 60 Å and an InGaAsP barrier layer having a thickness of 100 Å. This period can be changed to 1 to 25 periods.

After this, a bulging active layer stripe was formed. A $SiN_x$ film having a thickness of 5,000 Å was formed below a pad electrode portion 8b, and a semi-insulated InP layer 11 having a thickness of 5 μm was grown by the MOCVD method. After this, a p-electrode 8 was formed, as shown in FIG. 3A. In the present example, the air-bridge portions 8c were formed in four positions and each had a width of about 5 μm. The remaining sizes were similar to those of the foregoing Example 1. In the present Example, too, the semi-insulated InP layer 11 in the region other than the p-electrode 8 was etched off, and the InP layer 11 below the air-bridge portion 8c was also removed by making use of the side etching. Next, an n-electrode 9 was formed, and a chip was formed. Since the semi-insulated burying was performed in the present Example, the capacitance was as small as about 0.5 pF, and the bandwidth was 50 GHz or more. Moreover, the relaxation oscillation frequency was enabled to reach 30 GHz at the output power of 20 mW by introducing the MQW active layer. As a result, the NRZ modulation of 30 Gb/s was possible.

In the foregoing Examples, the insulating film was made of $SiO_2$ or $SiN_x$, but another insulating material such as $Al_2O_3$ or an insulating high-molecular resin film such as a polyimide film was effective as the insulating film. Moreover, a p-substrate can be applied. Still moreover, the foregoing Examples were exemplified by the DFB laser, but the present invention can naturally be applied to the ordinary Fabry-Perot (FP) laser using the laser facets (or cleaved facets).

EXAMPLE 3

Figure 4:
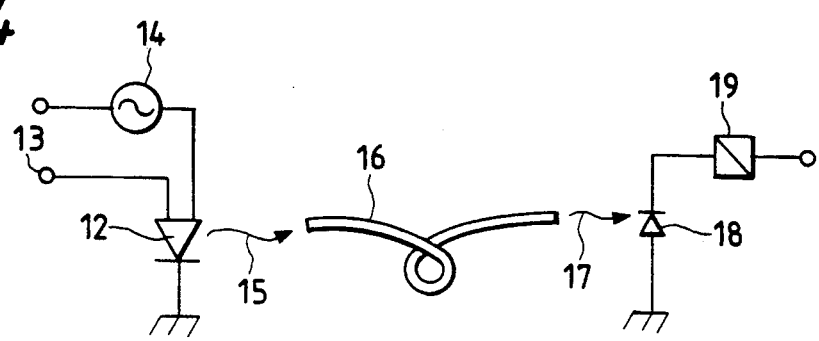
FIG. 4 is a schematic diagram showing one embodiment of the optical communication system according to the present invention.

FIG. 4 is a schematic diagram showing an embodiment, in which the high-speed semiconductor laser device of the present invention is applied to optical communications. In the semiconductor laser device of the present invention, as described in the foregoing Examples, a power supply 13 for bias and a signal generator 14 are connected to a high-speed semiconductor laser device 12 to modulate the laser light. Laser light 15 passes through an optical fiber 16, and the light 17 radiated from the optical fiber 16 is converted into electric signals by an optical receiver 18 and treated by a decoder 19. The modulation speed and the fiber length can be 30 Gb/s and 40 km, respectively.

In the detailed description of the preferred embodiments thus far made, the present invention has been described especially in connection with the DFB laser device. Despite this fact, however, the present invention should not be limited in the least to the laser device of this type but can be applied to a semiconductor laser device of another mode such as the DBR (i.e., Distributed Bragg Reflector) laser device if this device is required to have high-speed modulations.

We claim:

1. A semiconductor laser device comprising:
   a substrate;
   a mesa-stripe structure including an active region for radiating light formed on the substrate;
   a buried region formed on both sides of said mesa-stripe structure;
   a semiconductor region formed on the substrate and separated from said buried region by a gas; and
   a pair of electrodes for injecting carriers into said active region, a first of said electrodes having a bridge structure formed over both said mesa-stripe structure and said semiconductor region across the gas.

2. A semiconductor laser device according to claim 1, further comprising an insulator formed between said semiconductor region and said first electrode.

3. A semiconductor laser device according to claim 1, wherein the gas is air.

4. A semiconductor laser device according to claim 1, wherein said active region has a multi-quantum well layer.

5. A semiconductor laser device according to claim 1, wherein said mesa-stripe structure further includes a grating adjacent to said active region.

6. A semiconductor laser device comprising:
   a substrate;
   a mesa-stripe structure including an active region for radiating light formed on the substrate;
   a buried region formed on both sides of said mesa-stripe structure;
   a semiconductor region formed on the substrate apart from said buried region;
   a gap formed between said buried region and said semiconductor region; and
   a pair of electrodes for injecting carriers into said active region, a first of said electrodes having a bridge structure formed over both said mesa-stripe structure and said semiconductor region across the gap.

7. A semiconductor laser device according to claim 6, wherein said active region has a multi-quantum well.

8. A semiconductor laser device according to claim 6, further comprising an insulator formed between said semiconductor region and said first electrode.

9. A semiconductor laser device according to claim 6, wherein said bridge structure has at least one open window over the gap.

10. A semiconductor laser device according to claim 6, wherein said substrate has a grating thereon.

11. A semiconductor laser device comprising:
    a substrate having a grating thereon;
    a mesa-stripe structure including an active region for radiating light formed on the substrate;
    a semi-insulated region formed on both sides of said mesa-stripe structure;
    a semiconductor region formed on the structure apart from said semi-insulated region;
    a gap formed between said semi-insulated region and said semiconductor region; and
    a pair of electrodes for injecting carriers into said active region, one of said electrodes having a bridge structure formed over both said mesa-stripe structure and said semiconductor region across the gap.

12. A semiconductor laser device according to claim 11, wherein said gap is full of gas.

13. A semiconductor laser device according to claim 12, wherein said gas is air.

* * * * *

UNITED STATES PATENT AND TRADEMARK OFFICE
CERTIFICATE OF CORRECTION

PATENT NO. : 5,179,567
DATED : January 12, 1993
INVENTOR(S) : Uomi Kazuhisa, et. al.

It is certified that error appears in the above-indentified patent and that said Letters Patent is hereby corrected as shown below:

| Column | Line | |
|---|---|---|
| 1 | 22 | Change "pp. 117" to --pg. 117--. |
| 1 | 46 | Change "problems" to --problem--. |
| 1 | 56 | After "still" insert --,--. |
| 2 | 65 | Change "another" to --other--. |
| 5 | 12 | Change "were" to --was--. |
| 5 | 43 | After "still" insert --,--. |
| 5 | 67 | After "type" insert --,--. |

Signed and Sealed this

Twenty-first Day of December, 1993

Attest:

BRUCE LEHMAN

Attesting Officer   Commissioner of Patents and Trademarks